United States Patent
Lee

(10) Patent No.: US 10,957,249 B2
(45) Date of Patent: Mar. 23, 2021

(54) LIGHT EMITTING DISPLAY DEVICE HAVING NORMAL AND STANDBY MODES AND DRIVING METHOD THEREOF

(71) Applicant: LG DISPLAY CO., LTD., Seoul (KR)

(72) Inventor: YoungJoon Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/793,729

(22) Filed: Oct. 25, 2017

(65) Prior Publication Data

US 2018/0174514 A1 Jun. 21, 2018

(30) Foreign Application Priority Data

Dec. 20, 2016 (KR) .................. 10-2016-0174333

(51) Int. Cl.
*G09G 3/3233* (2016.01)
*G09G 3/3258* (2016.01)
*H05B 45/10* (2020.01)
*H01L 51/52* (2006.01)

(52) U.S. Cl.
CPC ......... *G09G 3/3233* (2013.01); *G09G 3/3258* (2013.01); *H05B 45/10* (2020.01); *G09G 2300/0861* (2013.01); *G09G 2310/0251* (2013.01); *G09G 2310/0262* (2013.01); *G09G 2320/0233* (2013.01); *G09G 2320/0626* (2013.01); *G09G 2330/022* (2013.01); *H01L 51/5203* (2013.01)

(58) Field of Classification Search
CPC .................................... G09G 3/3233
USPC ......................................... 345/82
See application file for complete search history.

(56) References Cited

U.S. PATENT DOCUMENTS

| | | | |
|---|---|---|---|
| 2011/0122119 A1* | 5/2011 | Bae | G09G 3/3233 345/211 |
| 2013/0082910 A1* | 4/2013 | Lee | G09G 3/3208 345/76 |
| 2016/0124491 A1* | 5/2016 | An | G06F 1/3265 713/323 |
| 2017/0116922 A1* | 4/2017 | Jung | G09G 3/3258 |

FOREIGN PATENT DOCUMENTS

| | | |
|---|---|---|
| CN | 101996573 A | 3/2011 |
| CN | 102426820 A | 4/2012 |
| CN | 103035174 A | 4/2013 |
| CN | 105374318 A | 3/2016 |

* cited by examiner

*Primary Examiner* — Long D Pham
(74) *Attorney, Agent, or Firm* — Birch, Stewart, Kolasch & Birch, LLP

(57) ABSTRACT

An organic light emitting display device can include a display panel that expresses brightness based on a driving current corresponding to a data voltage, a power source unit that supplies power to the display panel, and a controller configured that outputs a mode control signal for determining a normal mode and a standby mode, drives the display panel to display a first frame for a first time period in the normal mode based on the mode control signal, and drives the display panel to display a second frame for a second time period that is longer than the first time period in the standby mode based on the mode control signal, in which the power source unit supplies a compensation voltage to at least one pixel during the standby mode for compensating a change in the data voltage in the pixel.

18 Claims, 8 Drawing Sheets

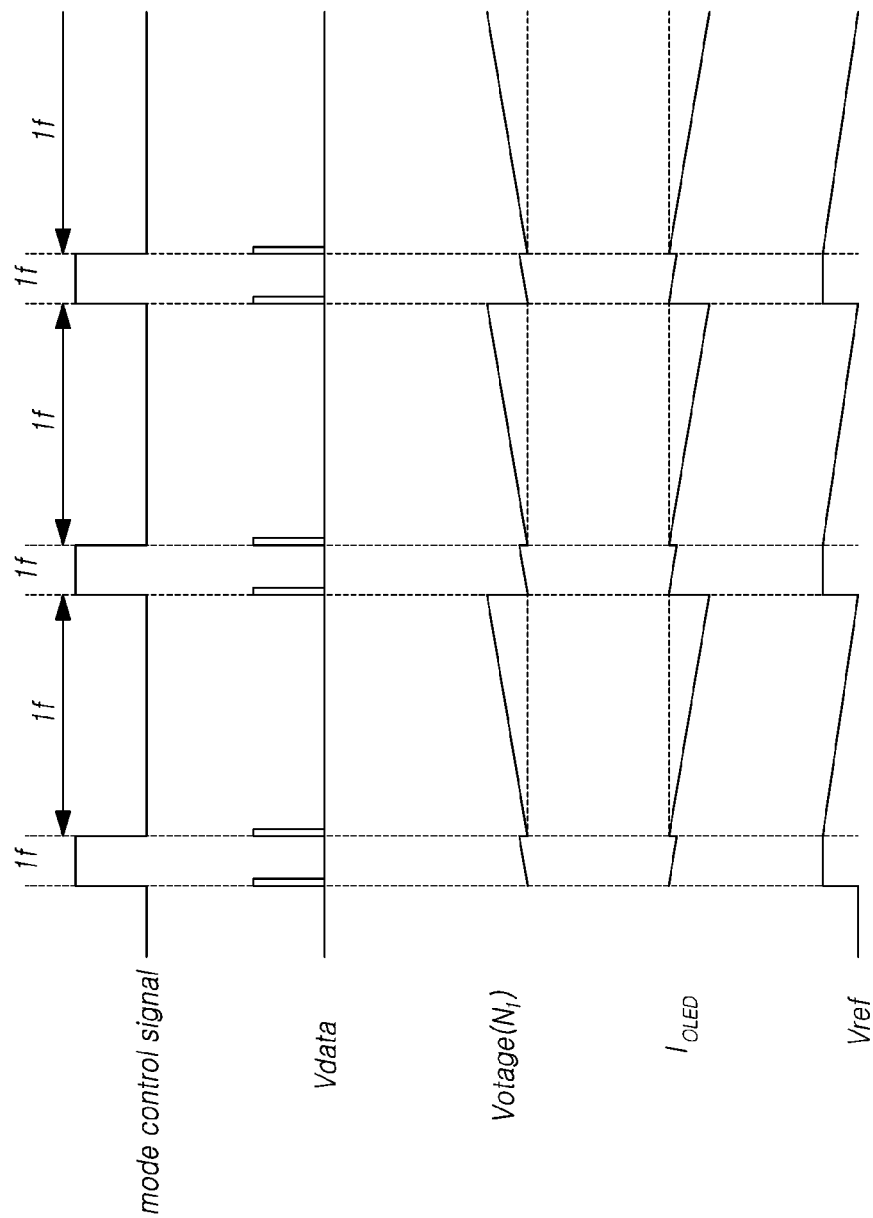

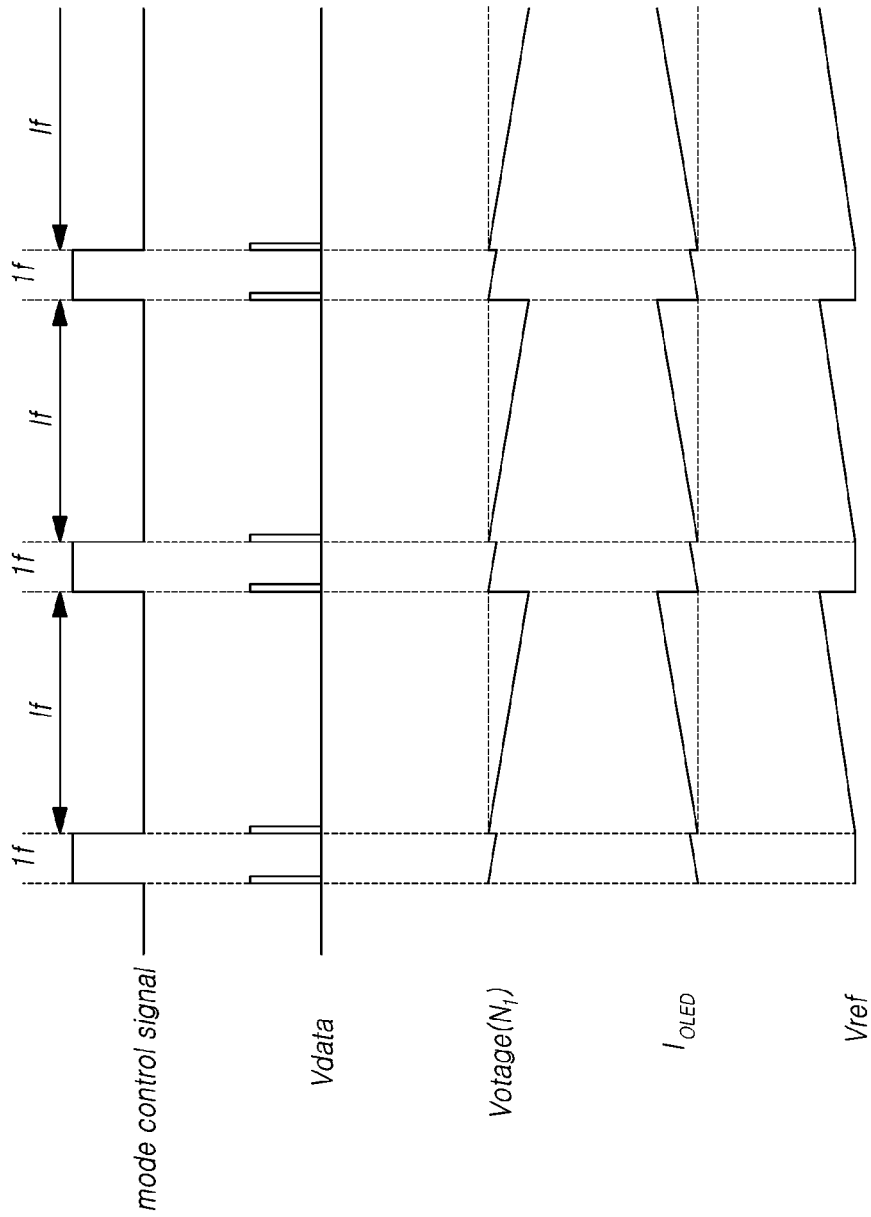

LIGHT EMITTING DISPLAY DEVICE HAVING NORMAL AND STANDBY MODES AND DRIVING METHOD THEREOF

CROSS-REFERENCE TO RELATED APPLICATION

This application claims priority from Korean Patent Application No. 10-2016-0174333, filed in the Republic of Korea on Dec. 20, 2016, which is hereby incorporated by reference for all purposes as if fully set forth herein.

BACKGROUND OF THE INVENTION

Field of the Invention

The present invention relates to an organic light emitting display device, and further relates to a method of driving the same.

Description of the Related Art

With the development of the information society, display devices for displaying images are being increasingly required in various forms, and various types of display devices, such as liquid crystal display (LCD) devices, plasma display devices, and organic light emitting display (OLED) devices, are utilized.

Also, from among the display devices, an organic light emitting display device that employs an organic light emitting diode, which is a spontaneous light emitting device, may have an excellent color reproduction range, viewing angle, response characteristics, or the like. Also, the organic light emitting display device is thin and light, and consumes a small amount of power, and thus, the organic light emitting display device has been widely utilized for mobile devices such as a smart phone, a tablet PC, and the like.

A mobile device uses a battery to receive a supply of power, and thus, an available usage time may be determined based on the capacity of the battery. However, the mobile device is developed to be thin and light for convenient use, and thus, the battery may not be designed to have a large capacity, which leads to a short available usage time. Particularly, smart phones and tablet PCs may include various sensors, a touch panel, and the like to perform various functions, and thus, may be required to extend a usage time by reducing the power consumption.

SUMMARY OF THE INVENTION

An aspect of the present invention is to provide an organic light emitting display device for reducing power consumption, and a method of driving the same.

Another aspect of the present invention is to provide an organic light emitting display device for suppressing a change in brightness so as to avoid deterioration in quality of an image, and a method of driving the same.

In accordance with an aspect of the present invention, there is provided an organic light emitting display device, including: a display panel configured to express brightness by a driving a current corresponding to a data voltage by receiving a supply of a first power source and a second power source, and to operate by distinguishing a normal mode and a standby mode based on a voltage level of the first power source; a controller configured to output a mode control signal for distinguishing the normal mode and the standby mode; and a power source unit configured to operate based on the mode control signal, and to transfer a compensation voltage for compensating for a change in the data voltage in the standby mode.

In another aspect of the present invention, there is provided an organic light emitting display device, including: a display panel including a plurality of pixels, which express brightness by a driving current corresponding to a data voltage by receiving a supply of a first power source and a second power source, and emits light based on the driving current based on a voltage level of the first power source; and a controller configured to perform control to output a mode control signal for distinguishing a high frequency driving and a low frequency driving, and to maintain a magnitude of the driving current when a mode is the low frequency driving.

In another aspect of the present invention, there is provided a driving method of an organic light emitting display device including a plurality of pixels, which express brightness based on a magnitude of a driving current corresponding to an applied data voltage, the method including: outputting a mode control signal to enable at least one pixel out of the plurality of pixels to operate by distinguishing a first driving and a second driving; and maintaining an amount of a driving current that flows through the pixel to be regular when the at least one pixel is controlled to operate in the second driving based on the mode control signal.

According to the present embodiments, an organic light emitting display device, which may reduce the power consumption, and an operating method thereof may be provided.

According to the present embodiments, an organic light emitting display device, which does not deteriorate quality of an image, and an operating method thereof may be provided.

BRIEF DESCRIPTION OF THE DRAWINGS

The above and other objects, features, and advantages of the present invention will be more apparent from the following detailed description taken in conjunction with the accompanying drawings, in which:

FIG. 3A is a waveform diagram illustrating voltage waveforms supplied to the pixel of FIG. 2 based on a mode control signal according to an embodiment;

FIG. 3B is a waveform diagram illustrating voltage waveforms supplied to the pixel of FIG. 2 based on a mode control signal according to an embodiment;

DETAILED DESCRIPTION OF THE EMBODIMENTS

Figure 1:
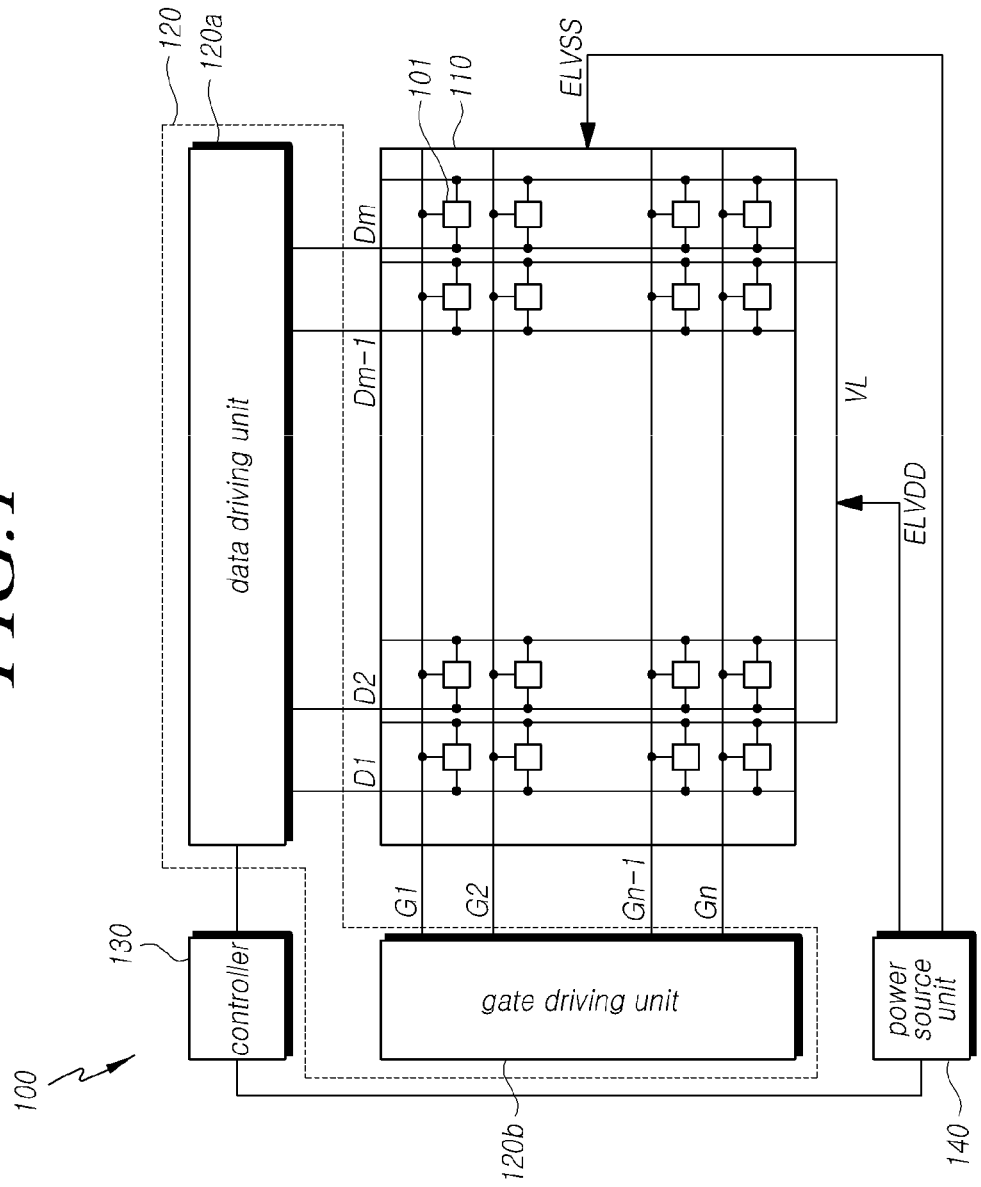
FIG. 1 is a diagram illustrating an organic light emitting display device according to an embodiment.

Hereinafter, some embodiments of the present invention will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In a situation that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a diagram illustrating an embodiment of an organic light emitting display device according to an embodiment.

Referring to FIG. 1, an organic light emitting display device 100 can include a display panel 110, which receives a supply of a first power source (ELVDD) and second power source (ELVSS) and expresses brightness by a driving current corresponding to a data voltage. The display panel 110 can operate by distinguishing a normal mode and a standby mode. Also, the display panel 110 can include a plurality of pixels. The organic light emitting display device 100 can include a controller 130, which performs control to output a mode control signal for distinguishing a normal mode and a standby mode, and maintains a magnitude of a driving current when a mode corresponds to the standby mode. Also, the organic light emitting display device 100 can include a power source unit 140, which receives a mode control signal, and supplies a first power source (ELVDD) and a second power source (ELVSS) to the display panel 110. Also, the power source unit 140 can transfer a compensation voltage that compensates for a change in a data voltage in the standby mode.

The normal mode is a mode that operates when a user uses the organic light emitting display device 100, and the standby mode is a mode that operates when the user does not use the organic light emitting display device 100. Also, the normal mode is a mode in which the organic light emitting display device 100 is operated at a brightness set by the user, and the standby mode is a mode in which the organic light emitting display device 100 is operated at a brightness lower than the brightness set by the user. Therefore, the power consumption in the standby mode can be embodied to be lower than the power consumption in the normal mode. However, this may not be limited thereto. The normal mode can be a high frequency driving, and the standby mode can be a low frequency driving. The high frequency driving is a driving in which a data voltage is maintained during a short period of time since a frame interval is short. The low frequency driving is a driving in which a data voltage is maintained during a long period of time since a frame interval is long. In the low frequency driving, the number of times that a voltage changes is small, and thus, the power consumption can be reduced. For example, the low frequency driving can use a lower frame rate than the high frequency driving to save power (e.g., 30 fps vs. 60 fps).

The display panel 110 can include a plurality of gate lines (G1, G2, ..., Gn−1, and Gn) for receiving a gate signal, and can include a plurality of data lines (D1, D2, ..., Dm−1, and Dm) for receiving a data signal. Also, the plurality of gate lines (G1, G2, ..., Gn−1, and Gn) and the plurality of data lines (D1, D2, ..., Dm−1, and Dm) may intersect. A pixel 101 can be disposed in each of the points where the plurality of gate lines (G1, G2, ..., Gn−1, and Gn) and the plurality of data lines (D1, D2, ..., Dm−1, and Dm) intersect. Also, the display panel 110 can further include a plurality of light emitting control lines.

Also, a first power source line (VL) that transfers a voltage of the first power source (ELVDD) to a plurality of pixels 101 is disposed in the display panel 110, and each pixel 101 can be provided with the voltage of the first power from the first power source line (VL). Also, the display panel 110 can include a common electrode disposed therein, and each pixel 101 can be provided with a voltage of the second power source (ELVSS) from a common electrode. The display panel 110 can include a voltage compensation line (Vref) that transfers a compensation voltage to each pixel 101. The compensation voltage is output based on a mode control signal, and maintains the brightness of the pixel 101 to be constant in a low frequency driving, thereby preventing deterioration in quality of an image.

Also, the organic light emitting display device 100 can include a drive IC 120 that transfers a gate signal and a data signal to gate lines (G1, G2, ..., Gn−1, and Gn) and a plurality of data lines (D1, D2, ..., Dm−1, and Dm), respectively. The drive IC 120 can include: a gate driving unit 120b that drives a gate signal; and a data driving unit 120a that receives a digital image signal, converts the same to a data signal of an analog type, and operates as a data line. Here, although the gate driving unit 120b included in the drive IC 120 is illustrated as an element independent from the display panel 110, this may not be limited thereto. The drive IC 120 can be disposed in a non-display area of the display panel 110. The gate driving unit 120b disposed in a non-emission area of the display panel 110 can be referred to as a gate in panel (GIP). Also, the drive IC 120 can transfer a light emission control signal to a pixel through a plurality of light emission control lines. A light emission control signal can be output from the gate driving unit 120b.

The controller 130 can transfer a control signal to the drive IC 120. A control signal transferred to the drive IC 120 can include a gate start pulse, a data start pulse, a horizontal synchronization signal, a vertical synchronization signal, and a clock signal. The controller 130 can enable the high frequency driving or the low frequency driving based on a control signal. Also, the controller 130 can output a mode control signal. The controller 130 can enable the display panel 110 to drive in one of a normal mode and a standby mode based on a mode control signal. The controller 130 can perform the high frequency driving in the normal mode, and the low frequency driving in the standby mode.

The power source unit 140 can generate a first power source (ELVDD) and a second power source (ELVSS), and supply the same to the display panel 110. The first power source (ELVDD) can be transferred to the first power source line (VL) of the display panel 110, and the second power source can be transferred to the common electrode of the display panel 110. However, this may not be limited thereto. Also, the power source unit 140 can output a compensation voltage and transfer the same to the display panel 110 in the low frequency driving. Also, the power source unit 140 can transfer an initialization power to initialize the pixel 101. However, power supplied from the power source unit 140 may not be limited thereto. Also, although the power source unit 140 is illustrated as a single element, this may not be limited thereto.

When the power source unit 140 receives a mode control signal from the controller 130, the power source unit 140 can output a compensation voltage. When the display panel 110 operates in the low frequency driving based on a mode control signal, the power source unit 140 can supply a compensation voltage to the display panel 110.

Figure 2:
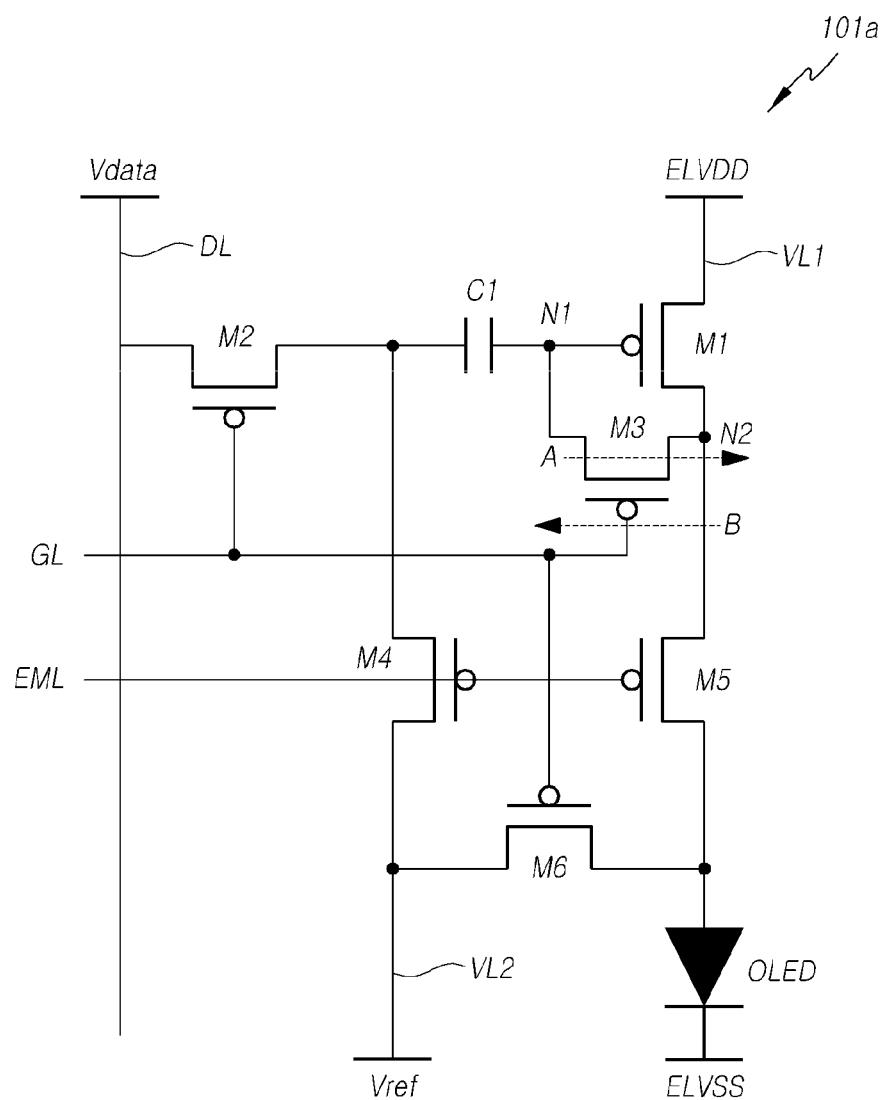
FIG. 2 is a circuit diagram illustrating a first embodiment of a pixel employed by the organic light emitting display device of FIG. 1.

FIG. 2 is a circuit diagram illustrating a first embodiment of the pixel of FIG. 1.

Referring to FIG. 2, the pixel 101 can include a pixel circuit 101a that generates a driving current, and an organic light emitting diode (OLED) that receives a driving current generated from the pixel circuit 101a and emits light. Also, the pixel circuit 101a can include a first transistor (M1) to a sixth transistor (M6). Also, the pixel 101 can include a first capacitor (C1). Each transistor can include a first electrode, a second electrode, and a gate electrode. The first electrode can be a source electrode and the second electrode can be a drain electrode. However, this may not be limited thereto. Also, although each transistor is illustrated as a transistor of a PMOS type, this may not be limited thereto. Also, the pixel circuit 101a can receive a first power source (ELVDD), a second power source (ELVSS), a data voltage (Vdata), a gate signal, and a light emission control signal (EM). Also, the pixel circuit 101a can receive an initialization voltage in the high frequency driving, and receive a compensation voltage in the low frequency driving.

Regarding the first transistor (M1), a first electrode can be connected with a first power source line (VL1) that supplies the first power source (ELVDD), and a second electrode can be connected with a second node (N2). Also, a gate electrode can be connected with a first node (N1). The first transistor (M1) can enable a driving current to flow in the direction from the first electrode to the second electrode, based on the first node (N1). The first transistor (M1) can be referred to as a driving transistor.

In a second transistor (M2), a first electrode can be connected with a data line (DL) that transfers a data voltage (Vdata), and a second electrode can be connected with a first electrode of the first capacitor (C1). Also, a gate electrode can be connected with a gate line (GL) that transfers a gate signal. The second transistor (M2) can transfer a data voltage (Vdata) to the first electrode of the first capacitor (C1), based on a gate signal.

In a third transistor (M3), a first electrode can be connected with a second node (N2) and a second electrode can be connected with a first node (N1). Also, a gate electrode can be connected with a gate line (GL). The third transistor (M3) can enable the first node (N1) and the second node (N2) to have the same voltage, based on a gate signal.

In a fourth transistor (M4), a first electrode can be connected with the second power source line (VL2) that transfers an initialization voltage (Vref), and a second electrode can be connected with the second electrode of the second transistor (M2) and the first electrode of the first capacitor (C1). Also, a gate electrode can be connected with a light emission control line (EML) that transfers a light emission control signal. Therefore, an initialization voltage (Vref) can be transferred to the first electrode of the first capacitor (C1), based on a light emission control signal. Also, the fourth transistor (M4) can receive a compensation voltage from the second power source line (VL2) during the low frequency driving.

In a fifth transistor (M5), a first electrode can be connected with the second node (N2), and a second electrode can be connected with an anode electrode of an organic light emitting diode (OLED). Also, a gate electrode can be connected with the light emission control line (EML). The fifth transistor (M5) can enable a driving current that flows through the second node (N2) to flow through the organic light emitting diode (OLED), based on a light emission control signal.

In a sixth transistor (M6), a first electrode can be connected with the second power source line (VL2) and a second electrode can be connected with an anode electrode of the organic light emitting diode (OLED). Also, a gate electrode can be connected to the gate line (GL). The sixth transistor (M6) can transfer an initialization voltage (Vref) to the anode electrode of the organic light emission diode (OLED), based on a gate signal.

Regarding the first capacitor (C1), a first electrode can be connected with the second electrode of the second transistor (M2), and a second electrode can be connected with the first node (N1). The first capacitor (C1) can receive a data voltage (Vdata) when the second transistor (M2) is turned on, receive an initialization voltage (Vref) when the fourth transistor (M4) is turned on. Also, in the low frequency driving, the first capacitor (C1) can receive a compensation voltage through the second power source line (VL2) when the fourth transistor (M4) is turned on. Therefore, a voltage stored in the first capacitor (C1) can be initialized based on the initialization voltage (Vref). Also, a voltage applied to the first electrode of the first capacitor (C1) can increase or decrease based on a compensation voltage. When the voltage applied to the first electrode of the first capacitor (C1) increases or decreases, a voltage of the first node (N1) that is connected with the second electrode of the first capacitor (C1) can increase or decrease.

Regarding the organic light emitting diode (OLED), an anode electrode can be connected with the second electrode of the fifth transistor (M5), and a cathode electrode can be connected with the common electrode that transfers the second power source (ELVSS). Therefore, when the fifth transistor (M5) is turned on, the organic light emitting diode can receive a driving current that flows through the second node (N2), and emit light. Also, when the sixth transistor (M6) is turned on, a threshold voltage of the organic light emitting diode (OLED) can be higher than an initialization voltage in order to prevent a current from flowing through the organic light emitting diode (OLED).

A driving current that flows through a pixel that is formed as described above can be defined by Equation 1 provided below.

$$I_{OLED} = \frac{\beta}{2}(V_{data} - V_{ref})^2 \quad \text{(Equation 1)}$$

(Here, IOLED denotes a magnitude of a driving current, β denotes a constant, Vdata denotes a data voltage, and Vref denotes an initialization voltage.)

In the pixel 101 formed as described above, when a driving current flows through the second node in the state in which the third transistor (M3) is turned off, a leakage current can flow in the direction (direction A) from the first node (N1) to the second node (N2) or in the direction (direction B) from the second node (N2) to the first node (N1), due to a difference in voltages between the first node (N1) and the second node (N2). Particularly, a leakage current can flow in the direction from the second node (N2) to the first node (N1) in a high gradation. A leakage current can flow in the direction from the first node (N1) to the second node (N2) in a low gradation.

When a leakage current flows in the direction from the second node (N2) to the first node (N1), a voltage of an electrode that is connected with the first node (N1) of the first capacitor (C1) may increase. When a leakage current flows in the direction from the first node (N1) to the second node (N2), a voltage of an electrode that is connected with the first node (N1) of the first capacitor (C1) may decrease. That is, due to the leakage current that occurs in the third transistor (M3), the voltage of the first node may increase or decrease. When the voltage of the first node (N1) increases, an amount of a driving current gradually decreases. When the voltage of the first node (N1) decreases, an amount of a driving current gradually increases. In the low frequency driving, a long period of time elapses before a data voltage (Vdata) is newly programmed, and thus, the voltage of the first node (N1) increases or decreases over a long period of time. Therefore, an amount of a driving current may become significantly large or small at a point when the data voltage (Vdata) is newly programmed. Accordingly, in the low frequency driving mode, a flicker phenomenon may occur when a data voltage (Vdata) is newly programmed to each pixel 101. Therefore, deterioration in quality of an image may occur, which is a drawback.

Regarding a capacitor, when a voltage applied to one electrode increases or decreases, a voltage applied to another electrode of the capacitor can also increase or decrease. Therefore, when the first capacitor (C1) increases or decreases a voltage by applying a compensation voltage to the second electrode that is connected with the second transistor, the voltage of the first node (N1) that is connected with the first electrode of the first capacitor (C1) can also increase or decrease by a compensation voltage. Therefore, when the voltage of the first node (N1) increases due to a leakage current, the voltage of the first node (N1) can be maintained at a regular or constant level (e.g., within an acceptable range) by decreasing a compensation voltage based on the increase in the voltage at the first node (N1). Also, when the voltage of the first node (N1) decreases, the voltage of the first node (N1) can be maintained to at a regular or acceptable level by increasing a compensation voltage based on the decrease in the voltage of the first node (N1), and thus, a flicker phenomenon can be prevented.

FIG. 3A is a waveform diagram illustrating voltage waveforms supplied to the pixel of FIG. 2 based on a mode control signal. FIG. 3B is a waveform diagram illustrating another example of voltage waveforms supplied to the pixel of FIG. 2.

Referring to FIGS. 3A and 3B, a mode control signal can be output as a high state during the high frequency driving. A mode control signal can be output as a low state during the low frequency driving. In this instance, a data voltage (Vdata) can be determined based on a gradation. Also, the length of a frame (1f) in the high frequency driving and the length of a frame (1f) in the low frequency driving can be set to be different from each other. The length of a frame (1f) in the low frequency driving can be set to be longer than the length of a frame in the high frequency driving. A frame is changed at a high speed in the high frequency driving, and thus, an increase and a decrease of a voltage frequently occurs. Conversely, a frame is changed at a low speed in the low frequency driving, and thus, an increase and a decrease of a voltage may not occur frequently. When the increase and the decrease of a voltage does not occur frequently, the power consumption in the power source unit 140 is lower. Here, although it is illustrated that high frequency driving and low frequency driving are performed alternately based on a frame (1f), the present invention may not be limited thereto. The high frequency driving and the low frequency driving can each continuously operate for a plurality of frames.

FIG. 3A is a waveform corresponding to a data voltage (Vdata) of a high gradation. When a data voltage (Vdata) corresponds to a high gradation, a leakage current that flows through the third transistor (M3) can flow in the direction (direction B) from the second node (N2) to the first node (N1). As described above, when the leakage current flows in the direction (direction B) from the second node (N2) to the first node (N1), a voltage of the first node (N1) increases, and thus, an amount of a driving current that flows through the second node (N2) may decrease.

FIG. 3B is a waveform corresponding to a data voltage (Vdata) of a low gradation. When a data voltage (Vdata) corresponds to a low gradation, a leakage current that flows through the third transistor (M3) may flow in the direction (direction A) from the first node (N1) to the second node (N2). When the leakage current flows in the direction (direction A) from the first node to the second node, the voltage of the first node (N1) may decrease, and thus, an amount of a driving current that flows through the second node (N2) may increase.

When an amount of a driving current decreases or increases as described above, a data voltage (Vdata) is maintained for a short period of time in the high frequency driving before a new data voltage is reprogrammed, and thus, a period of time in which an amount of a driving current decreases may be short. Therefore, a change in the amount of the driving current may not be large, and thus, a brightness deviation may not be recognizable. However, in the low frequency driving, a data voltage (Vdata) is maintained for a long period of time before a new data voltage (Vdata) is reprogrammed, and thus, a change in an amount of a driving current is large and a brightness deviation may be recognized. Accordingly, a flicker phenomenon may occur in the low frequency driving.

Therefore, to overcome the above described drawback, an initialization voltage (Vref) is applied as a compensation voltage during the low frequency driving in order to decrease a voltage level of the compensation voltage. Accordingly, as a voltage of the second electrode of the first capacitor (C1) decreases, a voltage of the first electrode of the first capacitor (C1) is also decreased, and thus, an increase in the voltage of the first node (N1) caused by a leakage current can be prevented. Also, when a voltage level of a compensation voltage increases, a voltage of the second electrode of the first capacitor (C1) may increase. Accordingly, a voltage of the first electrode of the first capacitor (C1) also increases, and thus, a decrease in a voltage of the first node (N1) caused by a leakage current can be prevented. For example, the dotted lines in FIGS. 3A and 3B show the voltage of the first node (N1) and the current flowing through the organic light emitting diode (OLED) when they have been compensated during the low frequency driving (standby mode) with the compensation voltage (Vref).

When a data voltage is a high gradation, a voltage of the first node (N1) may increase due to a leakage current. A voltage of the first node (N1) connected with the first electrode of the first capacitor (C1) can be prevented from increasing by decreasing a voltage of the second electrode of the first capacitor (C1) based on an increase in a voltage of the first node (N1) during the low frequency driving. Therefore, an amount of a driving current that flows through the second node (N2) can be maintained at a regular or acceptable level. Therefore, a compensation voltage can be a voltage that instantly decreases.

Also, when a data voltage is a low gradation, a voltage of the first node (N1) may decrease due to a leakage current. A voltage of the first node (N1) connected with the first electrode of the first capacitor (C1) can be prevented from decreasing, by increasing a voltage of the second electrode of the first capacitor (C1) based on a decrease in a voltage of the first node (N1) during the low frequency driving. Therefore, an amount of a driving current that flows through the second node (N2) can be maintained at a regular or acceptable level. Therefore, a compensation voltage can be a voltage that instantly increases.

A compensation voltage that increases or decreases a voltage of the first electrode of the first capacitor (C1) can be transferred to the first electrode of the first capacitor (C1) through the second power source line (VL2) through which an initialization voltage (Vref) is transferred. Also, during the low frequency driving, the compensation voltage can be supplied through the second power source line (VL2) when the power source unit 140 of FIG. 1 receives a mode control signal and determines that a mode is the low frequency driving.

Figure 4:
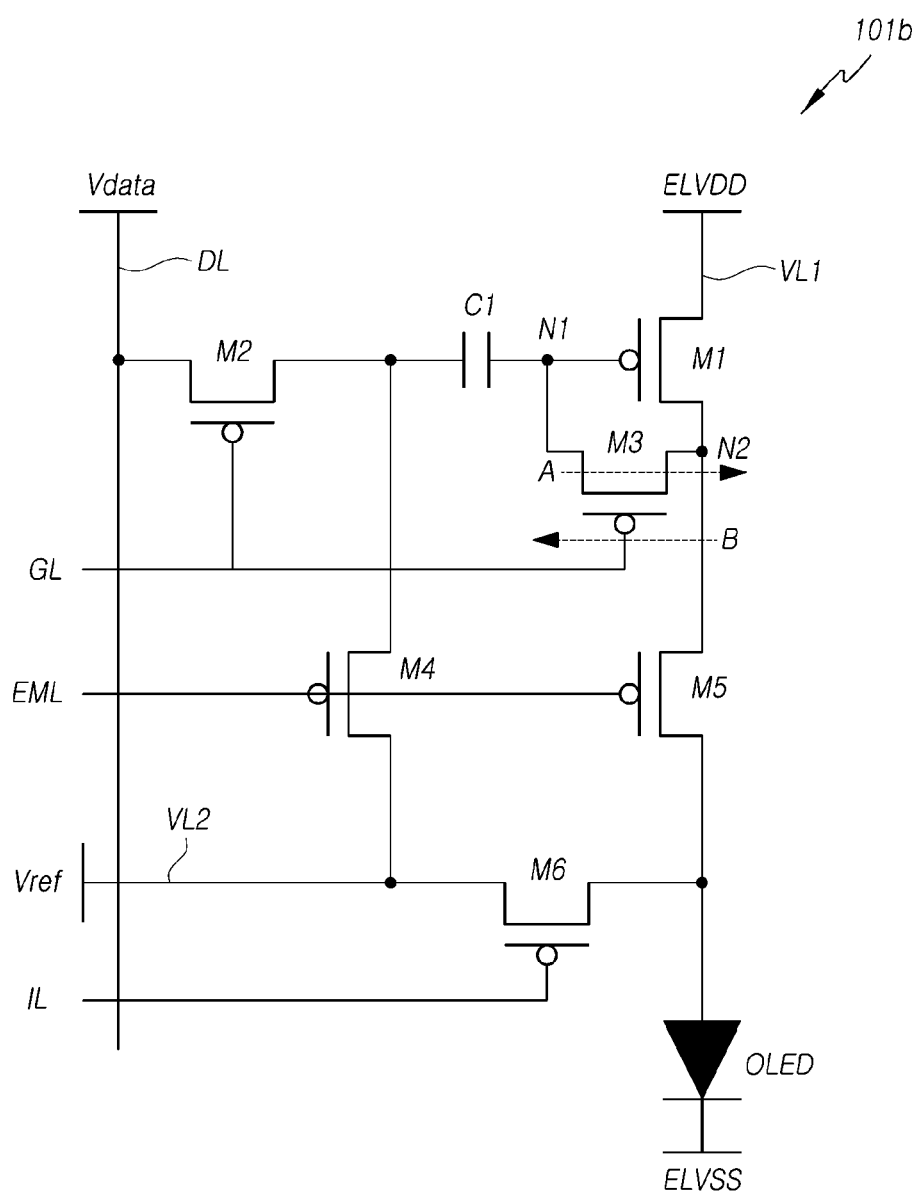
FIG. 4 is a circuit diagram illustrating a second embodiment of a pixel employed by the organic light emitting display device of FIG. 1.

FIG. 4 is a circuit diagram illustrating a second embodiment of the pixel of FIG. 1.

Referring to FIG. 4, the pixel 101 can include a pixel circuit 101b that generates a driving current and an organic light emitting diode (OLED). The pixel circuit 101b can receive a data voltage (Vdata), a gate signal, a light emission control signal (EML), an initialization control signal (IL), a voltage of a first power source (ELVDD), a voltage of a second power source (ELVSS), and an initialization voltage (Vref). Also, the pixel circuit 101b can include a first to sixth transistor (M1 to M6) and a first capacitor (C1). Here, the first transistor (M1) can be a driving transistor. Also, the first through sixth transistors (M1 to M6) each can include a first electrode, a second electrode, and a gate electrode. The first electrode can be a drain electrode, and the second electrode can be a source electrode. However, this may not be limited thereto. Also, the first to sixth transistors (M1 to M6) can be transistors of a PMOS type. However, this may not be limited thereto, and the first to sixth transistors (M1 to M6) can be transistors of an NMOS type.

In the first transistor (M1), a first electrode can be connected with a first power source line (VL1) that supplies a first power source (ELVDD), a gate electrode can be connected with a first node (N1), and a second electrode can be connected with a second node (N2). The first transistor (M1) can enable a driving current to flow from the first electrode connected with the first power source (ELVDD) to the second electrode connected with the second node (N2), based on a voltage transferred to the first node (N1).

In the second transistor (M2), a first electrode can be connected with a data line (DL), a gate electrode can be connected with a gate line (GL) that transfers a gate signal, and a second electrode can be connected with a first electrode of the first capacitor (C1). The second transistor (M2) can transfer a data voltage (Vdata) corresponding to a data signal from the first electrode connected with the data line (DL) to the first electrode of the first capacitor (C1), based on a gate signal transferred to the gate electrode.

In the third transistor (M3), a first electrode can be connected with the second node (N2), a gate electrode can be connected with a gate line (GL), and a second electrode can be connected with the first node (N1). Based on a gate signal transferred to the gate electrode, the third transistor (M3) can enable the first node (N1) and the second node (N2) to have the same voltage, and thus, the first transistor (M1) can enable a current to flow through the second node (N2). In this instance, a voltage corresponding to a threshold voltage can be stored in the first capacitor (C1) connected with the first node (N1).

In the fourth transistor (M4), a first electrode can be connected with a second power source line (VL2) that transfers an initialization voltage (Vref), a gate electrode can be connected with a light emission control line (EML) through which a light emission control signal is transferred, and a second electrode can be connected with the first electrode of the first capacitor (C1) and the second electrode of the second transistor (M2). Accordingly, the fourth transistor (M4) can transfer the initialization voltage (Vref) to the first electrode of the first capacitor (C1) and the second electrode of the second transistor (M2) based on a light emission control signal transferred to the gate electrode.

In the fifth transistor (M5), a first electrode is connected with the second node (N2), a gate electrode is connected with the light emission control line (EML) that transfers a light emission control signal, and a second electrode is connected with an anode electrode of an organic light emitting diode (OLED). Accordingly, based on a light emitting control signal transferred through the gate electrode, the fifth transistor (M5) can transfer a driving current to the organic light emitting diode (OLED).

In a sixth transistor (M6), a first electrode can be connected with a second power source line (VL2) that transfers an initialization voltage (Vref), a gate electrode can be connected with an initialization control line (IL) that transfers an initialization control signal, and a second electrode can be connected with an anode electrode of an organic light emitting diode (OLED). Accordingly, the sixth transistor (M6) can transfer the initialization voltage (Vref) to the anode electrode of the organic light emitting diode (OLED) based on an initialization control signal transferred to the gate electrode. The initialization voltage (Vref) is lower than the threshold voltage of the organic light emitting diode (OLED), and thus, can prevent the organic light emitting diode (OLED) from emitting light in an initialization interval in which the initialization voltage (Vref) is transferred.

In the first capacitor (C1), the first electrode can be connected with the first node (N1), and a second electrode can be connected with the second electrode of the fourth transistor (M4).

Also, in the organic light emitting diode (OLED), an anode electrode can be connected with the second electrode of the fifth transistor (M5) and the second electrode of the sixth transistor (M6), and a cathode electrode can be connected with the second power source (ELVSS). Also, the organic light emitting diode (OLED) receives a driving current and can emit light when the fifth transistor (M5) is turned on by a light emission control signal (EML).

The pixel 101 formed as described above can use an initialization voltage (Vref) as a compensation voltage during the low frequency driving. In the low frequency driving, when the fourth transistor (M4) is turned on by a light emission control signal transferred through the light emission control line (EML) and the sixth transistor (M6) is turned on by an initialization control signal transferred through an initialization control line (IL), an initialization voltage (Vref) can be supplied to the second electrode of the first capacitor (C1). In this instance, when the initialization voltage (Vref) is a compensation voltage as described in FIG. 3A or FIG. 3B, a voltage of the second electrode of the first capacitor (C1) may vary. As the voltage of the second electrode of the first capacitor (C1) varies, a voltage of the first node (N1) connected with the first electrode of the first capacitor (C1) may increase or decrease. Therefore, although a leakage current flows through the third transistor (M3) in the direction (direction B) from the second node (N2) to the first node (N1) or in the direction (direction A) from the first node (N1) to the second node (N2), an initialization voltage (Vref) compensates for a change in a voltage of the first electrode of the first capacitor (C1), and the voltage can be maintained to at a regular or constant level. Therefore, the magnitude of a driving current that flows through the second node (N2) of the first transistor (M1) can also be maintained at a regular or constant level.

Figure 5:
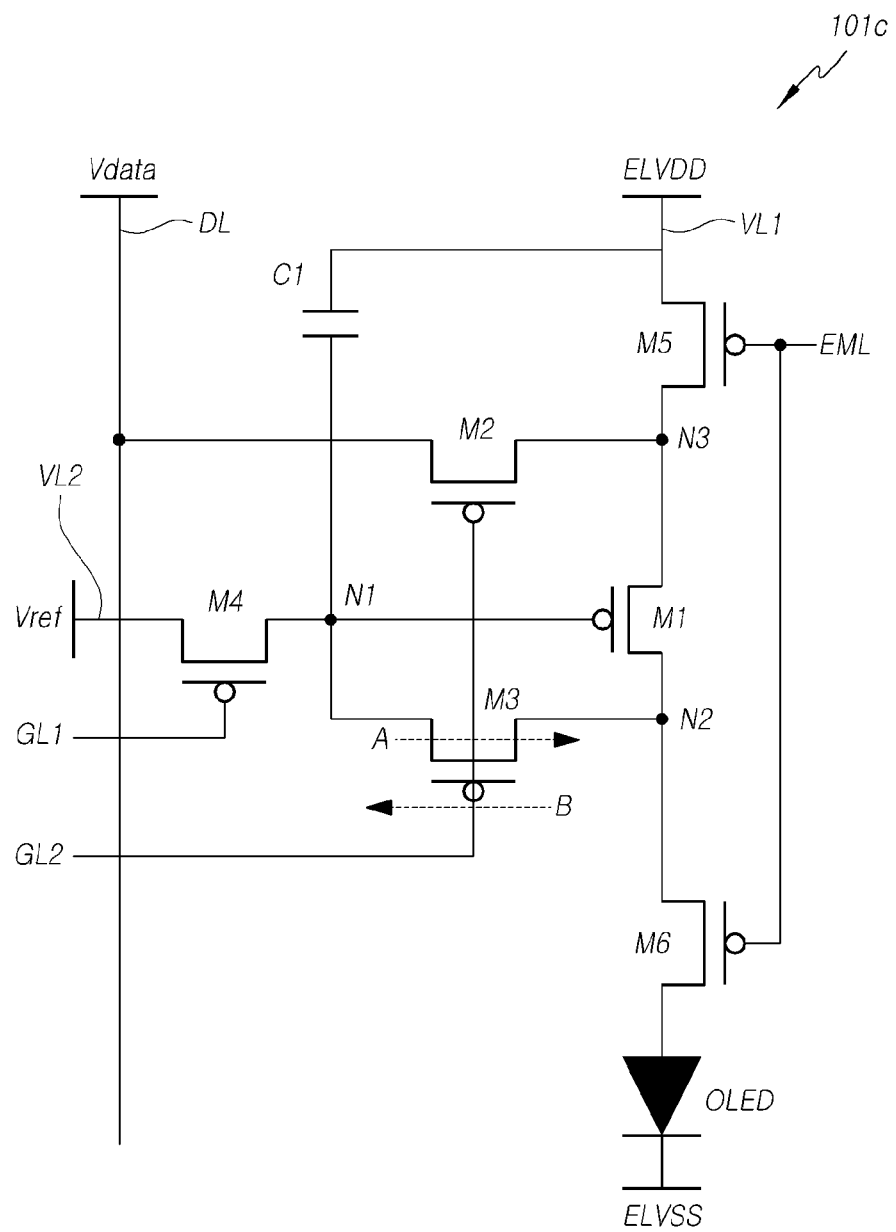
FIG. 5 is a circuit diagram illustrating a third embodiment of a pixel employed by the organic light emitting display device of FIG. 1.

FIG. 5 is a circuit diagram illustrating a third embodiment of a pixel employed by the organic light emitting display device of FIG. 1.

Referring to FIG. 5, the pixel 101 can include a pixel circuit 101c that generates a driving current and an organic light emitting diode (OLED). The pixel circuit 101c can receive a data voltage (Vdata), a first gate signal, a second gate signal, a light emitting control signal (EML), a voltage of a first power source (ELVDD), a voltage of a second power source (ELVSS), and an initialization voltage (Vref). Also, the pixel circuit 101d can include first to sixth transistors (M1 to M6) and a first capacitor (C1). Also, the first through sixth transistors (M1 to M6) can each include a first electrode, a second electrode, and a gate electrode. The first electrode can be a drain electrode, and the second electrode can be a source electrode. However, this may not be limited thereto. Also, the first to sixth transistors (M1 to M6) can be transistors of a PMOS type. However, this may not be limited thereto.

In the first transistor (M1), a first electrode can be connected with a third node (N3), a gate electrode can be connected with the first node (N1), and a second electrode can be connected with a second node (N2). The first transistor (M1) can enable a driving current to flow from the first electrode to the second electrode based on a voltage transferred to a gate electrode. The first transistor (M1) can be a driving transistor.

In the second transistor (M2), a first electrode can be connected with a data line (DL), a gate electrode can be connected with a second gate line (GL2), and a second electrode can be connected with the third node (3N). The second transistor (M2) can transfer a data voltage to the third node (N3) based on a second gate signal transferred to the gate electrode through the second gate line (GL2).

In a third transistor (M3), a first electrode can be connected with the second node (N2), a gate electrode can be connected with the second gate line (GL2), and a second electrode can be connected with the first node (N1). The third transistor (M3) can enable the first node (N1) and the second node (N2) to have the same potential based on a second gate signal transferred to the gate electrode through the second gate line (GL2).

In a fourth transistor (M4), a first electrode can be connected with a second power source line (VL2) that transfers an initialization voltage (Vref), a gate electrode can be connected with a first gate line (GL) through which a first gate signal is transferred, and a second electrode can be connected with the first node (N1). The fourth transistor (M4) can transfer an initialization voltage (Vref) to the first node (N1) based on a first gate signal transferred through the first gate line (GL1).

In a fifth transistor (M5), a first electrode can be connected with a first power source line (VL1) that transfers a first power source (ELVDD), a gate electrode can be connected with a light emission control line (EML) that transfers a light emission control signal, and a second electrode can be connected with the third node (N3). The fifth transistor (M5) can supply, to the third node (N3), a voltage of the first power source (ELVDD) transferred to the first power source line (VL1), based on a light emission control signal transferred through the light emission control line (EML).

In the sixth transistor (M6), a first electrode can be connected with the second node (N2), a gate electrode can be connected to the light emission control line (EML) that transfers a light emission control signal, and a second electrode can be connected with an anode electrode of the organic light emitting diode (OLED). The sixth transistor (M6) can supply a driving current that flows through the second node (N2) to the organic light emitting diode (OLED) based on a light emission control signal transferred to the gate electrode.

In the first capacitor (C1), a first electrode can be connected with the first node (N1), a second electrode can be connected with the first power source line (VL) that supplies the first power source (ELVDD), and thus, the first capacitor (C1) can store a voltage corresponding to a data voltage. Also, the first capacitor (C1) can be initialized by an initialization voltage (Vref). When the second transistor (M2) and the third transistor (M3) are turned on by a second gate signal, a data voltage (Vdata) can be transferred to the first node (N1) through the first transistor (M1) and the third transistor (M3), and thus, a voltage corresponding to a threshold voltage can be stored in the first node (N1). Therefore, compensation for a change in the threshold value can be performed.

In the organic light emitting diode (OLED), an anode electrode can be connected with the second electrode of the sixth transistor (M6), and a cathode electrode can be connected with the second power source (ELVSS).

In the low frequency driving, the pixel 101c formed as described above can use a voltage of the first power source (ELVDD) as a compensation voltage. In the low frequency driving, in which a voltage of the first power source (ELVDD) is a compensation voltage as illustrated in FIG. 3A or FIG. 3B, a voltage of the second electrode of the first capacitor (C1) may vary. As the voltage of the second electrode of the first capacitor (C1) varies, a voltage of the first node (N1) connected with the first electrode of the first capacitor (C1) can increase or decrease. Therefore, although a leakage current flows through the third transistor (M3) in the direction (direction B) from the second node (N2) to the first node (N1) or in the direction (direction A) from the first node (N1) to the second node (N2), compensation for a change in a voltage of the first electrode of the first capacitor (C1) can be performed as the voltage of the first power source (ELVDD) varies, and the voltage can be maintained at a regular or constant level. Therefore, the magnitude of a driving current that flows through the second node (N2) of the first transistor (M1) can also be maintained at a regular or constant level.

Figure 6:
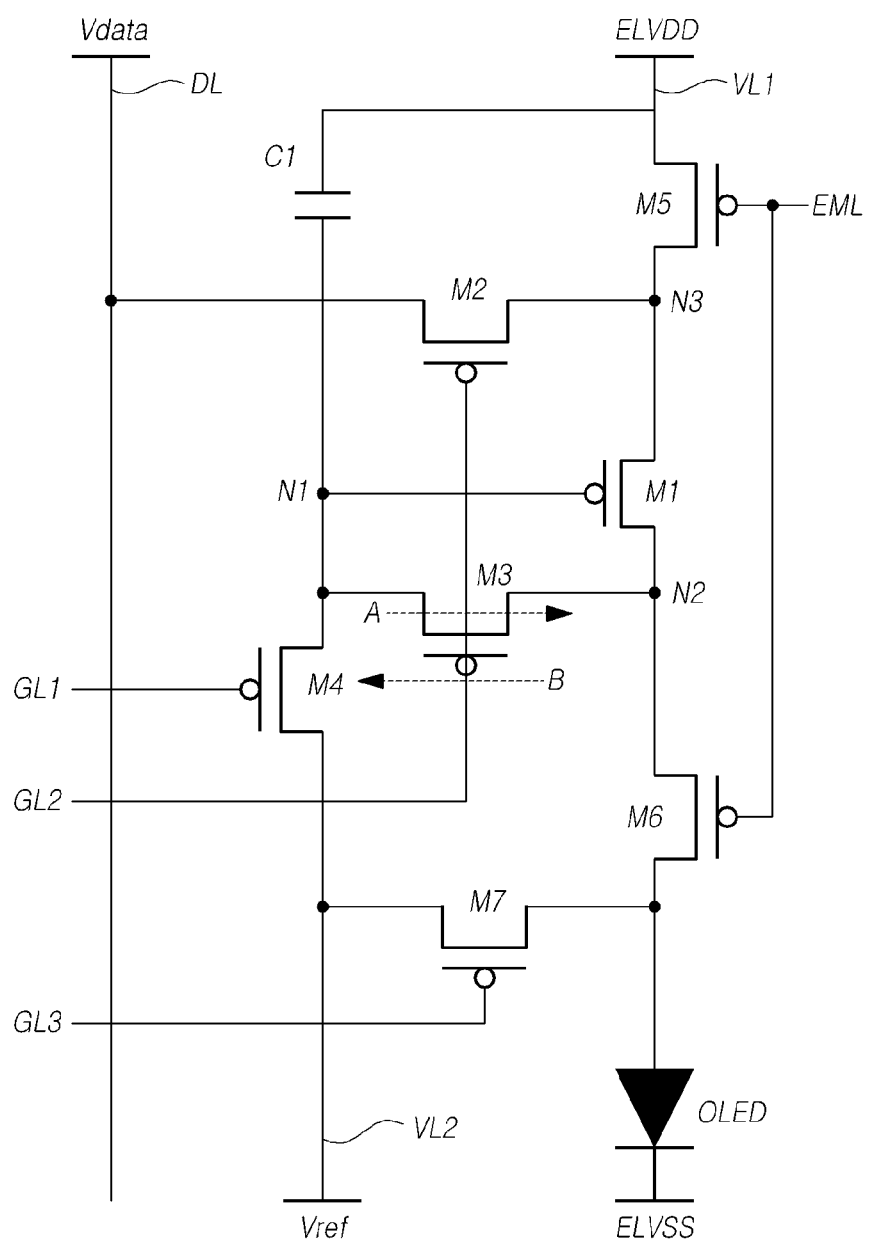
FIG. 6 is a circuit diagram illustrating a fourth embodiment of a pixel employed by the organic light emitting display device of FIG. 1.

FIG. 6 is a circuit diagram illustrating a fourth embodiment of a pixel employed by the organic light emitting display device of FIG. 1.

Referring to FIG. 6, the pixel 101 can include a pixel circuit 101d that generates a driving current and an organic light emitting diode (OLED). The pixel circuit 101d can receive a data voltage (Vdata), a first gate signal, a second gate signal, a third gate signal, a light emitting control signal, a voltage of a first power source (ELVDD), a voltage of a second power source (ELVSS), and an initialization voltage (Vref). Also, the pixel circuit 101d can include first to seventh transistors (M1 to M7) and a first capacitor (C1). Also, the first to seventh transistors (M1 to M7) each can include a first electrode, a second electrode, and a gate electrode. The first electrode can be a drain electrode, and the second electrode can be a source electrode. However, this may not be limited thereto. Also, the first to seventh transistors (M1 to M6) can be transistors of a PMOS type. However, this may not be limited thereto.

In the first transistor (M1), a first electrode can be connected with a third node (N3), a gate electrode can be connected with the first node (N1), and a second electrode can be connected with a second node (N2). The first transistor (M1) can enable a driving current to flow from the first electrode to the second electrode based on a voltage transferred to a gate electrode. The first transistor (M1) can be a driving transistor.

In a second transistor (M2), a first electrode can be connected with a data line (DL), a gate electrode can be connected with a second gate line (GL2), and a second electrode can be connected with the third node (N3). The second transistor (M2) can transfer a data voltage to the third node (N3) based on a second gate signal transferred to the gate electrode through the second gate line (GL2).

In a third transistor (M3), a first electrode can be connected with the second node (N2), a gate electrode can be connected with the second gate line (GL), and a second electrode can be connected with the first node (N1). The third transistor (M3) can control the first node (N1) and the second node (N2) to have the same potential based on a second gate signal transferred to the gate electrode through the second gate line (GL2).

In a fourth transistor (M4), a first electrode can be connected with a second power source line (VL2) that transfers an initialization voltage (Vref), a gate electrode can be connected with a first gate line (GL) through which a first gate signal is transferred, and a second electrode can be connected with the first node (N1). The fourth transistor (M4) can transfer an initialization voltage (Vref) to the first node (N1) based on a first gate signal transferred through the first gate line (GL1).

In a fifth transistor (M5), a first electrode can be connected with the first power source line (VL1) that transfers a first power source (ELVDD), a gate electrode can be connected with a light emission control line (EML) that transfers a light emission control signal, and a second electrode can be connected with the third node (N3). The fifth transistor (M5) can supply, to the third node (N3), a voltage of the first power source (ELVDD) transferred to the first power source line (VL1), based on a light emission control signal transferred through the light emission control line (EML).

In a sixth transistor (M6), a first electrode can be connected with the second node (N2), a gate electrode can be connected to the light emission control line (EML) that transfers a light emission control signal, and a second electrode can be connected with an anode electrode of the organic light emitting diode (OLED). The sixth transistor (M6) can supply a driving current that flows through the second node (N2) to the organic light emitting diode (OLED) based on a light emission control signal transferred to the gate electrode.

In the seventh transistor (M7), a first electrode can be connected with the second power source line (VL2) that transfers an initialization voltage (Vref), a gate electrode can be connected with the third gate line (GL3) that transfers a third gate signal, and a second electrode can be connected with an anode electrode of the organic light emitting diode (OLED). The seventh transistor (M7) can transfer an initialization voltage (Vref) to the anode electrode of an organic light emission diode (OLED) based on a third gate signal transferred through the third gate line (GL3) to the gate electrode. A voltage level of the initialization voltage (Vref) can be lower than a threshold voltage of the organic light emitting diode (OLED).

In the first capacitor (C1), a first electrode can be connected with the first node (N1), a second electrode can be connected with the first power source line (VL1) that supplies the first power source (ELVDD), and thus, can store a voltage corresponding to a data voltage (Vdata). Also, the first capacitor (C1) can be initialized by an initialization voltage (Vref). When the second transistor (M2) and the third transistor (M3) are turned on by a second gate signal, a data voltage (Vdata) can be transferred to the first node (N1) through the first transistor (M1) and the third transistor (M3), and thus, a voltage corresponding to a threshold voltage can be stored in the first node (N1). Therefore, compensation for a change in the threshold value can be performed.

In the organic light emitting diode (OLED), an anode electrode can be connected with the second electrode of the sixth transistor (M6) and the second electrode of the seventh transistor (M7), and a cathode electrode can be connected to the second power source (ELVSS).

In the low frequency driving, the pixel 101d formed as described above can use a voltage of the first power source (ELVDD) as a compensation voltage. In the low frequency driving, in the case in which a voltage of the first power source (ELVDD) is a compensation voltage as illustrated in FIG. 3A or FIG. 3B, a voltage of the second electrode of the first capacitor (C1) may vary. As the voltage of the second electrode of the first capacitor (C1) varies, a voltage of the first node (N1) connected with the first electrode of the first capacitor (C1) may increase or decrease. Therefore, although a leakage current flows through the third transistor (M3) in the direction (direction B) from the second node (N2) to the first node (N1) or in the direction (direction A) from the first node (N1) to the second node (N2), compensation for a change in a voltage of the first electrode of the first capacitor (C1) can be performed as the voltage of the first power source (ELVDD) varies, and the voltage can be maintained at a regular or constant level. Therefore, the magnitude of a driving current that flows through the second node (N2) of the first transistor (M1) can also be maintained at a regular or constant level.

Figure 7:
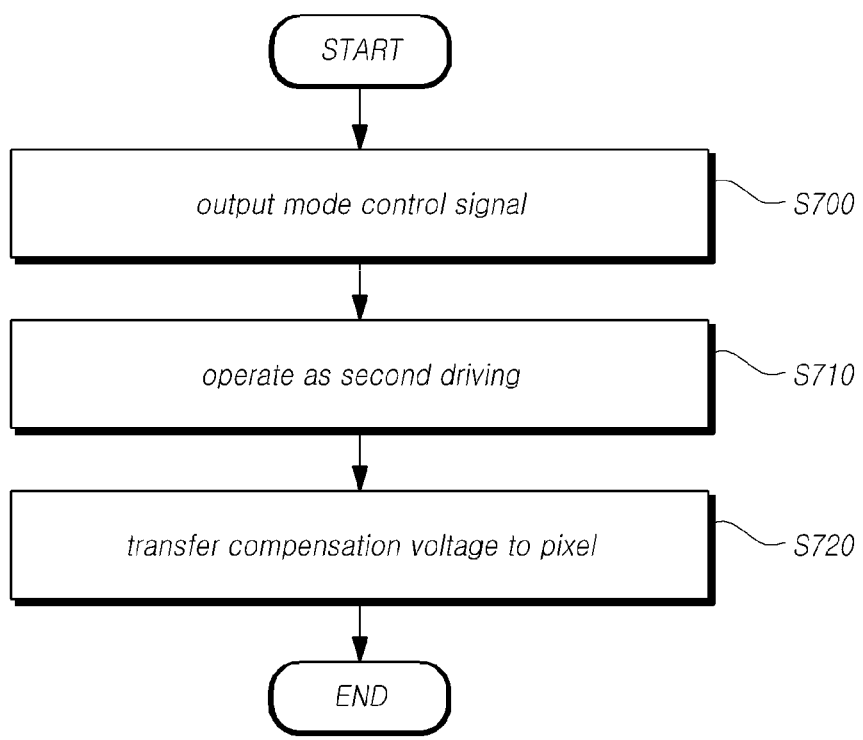
FIG. 7 is a flowchart illustrating an embodiment of a method of driving the organic light emitting display device of FIG. 1.

FIG. 7 is a flowchart illustrating an embodiment of a method of driving the organic light emitting display device of FIG. 1.

Referring to FIG. 7, a method of driving an organic light emitting display device including a plurality of pixels, which can express brightness based on a magnitude of a driving current corresponding to an applied data voltage.

Also, the driving method of the organic light emitting display device outputs a mode control signal that enables at least one pixel out of the plurality of pixels to operate according to a first driving mode or a second driving mode in operation S700. The second driving can be set to have a longer period of time until a data voltage changes than compared to the first driving. Also, the first driving can be a normal driving mode, and the second driving can be a standby driving mode. The normal driving mode can correspond to an interval in which an image is expressed at a brightness set by a user. The standby driving mode can be an interval in which an image is expressed at a brightness lower than a brightness set by a user. Also, the first driving can be a driving that displays a normal image, since the interval of a frame is set to be short. The second driving can be a driving that needs to maintain a programmed data voltage for a longer period of time than the first driving, since the interval of a frame is set to be longer than that of the first driving. The first driving can be referred to as a high frequency driving, and the second driving can be referred to as a low frequency driving.

The method controls at least one pixel to operate with the second driving based on the mode control signal in operation S710. Therefore, an amount of a driving current that flows through a pixel can be maintained at a regular level, even when holding the same valve for a long period of time. A data voltage is newly programmed for each frame. In the first driving, the interval of a frame is short, and thus, a programmed data voltage can be maintained for a short period of time. Therefore, an effect of a leakage current may be low. However, in the second driving, the interval of a frame is long, and thus, a programmed data voltage may be maintained during a long period of time. Therefore, an effect of a leakage current may be high. When at least one pixel is controlled to operate with the second driving based on the mode control signal, an amount of a driving current that flows through the pixel can be maintained to at a regular or acceptable level.

To maintain an amount of a driving current that flows through the pixel at a regular level, a compensation voltage can be transferred to the at least one pixel in operation S720. Compensation for a change in a data voltage is performed by transferring a compensation voltage to the pixel, and thus, the amount of the driving current that flows through the pixel can be maintained at a regular level (e.g., within an acceptable range or at a constant level). Also, when a data voltage corresponds to a high gradation, the compensation voltage can be a voltage that instantly decreases as illustrated in FIG. 3A. When a data voltage corresponds to a low gradation, the compensation voltage can be a voltage that instantly increases as illustrated in FIG. 3B.

The above description and the accompanying drawings provide examples of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the present invention. Therefore, the embodiments disclosed in the present invention are intended to illustrate examples of the present invention, and the scope of the present invention is not limited by the embodiments. The scope of the present invention shall be construed based on the accompanying claims so all of the technical ideas included within the scope equivalent to the claims belong to the present invention.

What is claimed is:

1. An organic light emitting display device, comprising:
a display panel including at least one pixel and configured to express brightness based on a driving current corresponding to a data voltage;
a power source unit configured to supply power to the display panel; and
a controller configured to:
output a mode control signal for determining a normal mode and a standby mode,
drive the display panel to display a first frame for a first time period in the normal mode based on the mode control signal, and
drive the display panel to display a second frame for a second time period that is longer than the first time period in the standby mode based on the mode control signal,
wherein the power source unit supplies a compensation voltage to the at least one pixel during the standby mode for compensating a change in the data voltage in the at least one pixel,
wherein the at least one pixel comprises:
an organic light emitting diode;
a driving transistor for supplying the driving current to the organic light emitting diode;
a second transistor including a first electrode connected to a data line, a gate electrode connected to a gate line, and a second electrode connected to a first electrode of a capacitor, the capacitor configured to store a voltage corresponding to the data voltage and including a second electrode connected to a first node;
a third transistor connected between the first node and a second node between the driving transistor and the organic light emitting diode, the third transistor including a gate electrode connected to the gate line;
a fourth transistor including a first electrode connected to a second voltage line, a second electrode connected between the second electrode of the second transistor and the first electrode of the capacitor and a gate electrode connected to a light emission control line;
a fifth transistor including a first electrode connected to the second node, a second electrode connected to an electrode of the organic light emitting diode, and a gate electrode connected to the light emission control line; and
an initialization voltage transfer transistor including a first electrode directly connected to the second voltage line and directly connected to the first electrode of the fourth transistor, a second electrode directly connected to the electrode of the organic light emitting diode, and a gate electrode directly connected to an initialization control line providing an initialization control signal for initializing the organic light emitting diode, the initialization voltage transfer transistor configured to supply an initialization voltage from the second voltage line to the electrode of the organic light emitting diode based on the initialization control signal from the initialization control line,
wherein the initialization control line is not connected to the gate electrode of second transistor,
wherein the compensation voltage is supplied to the capacitor during the second time period via the fourth transistor,
wherein when the second transistor and the third transistor are turned on based a gate signal from the gate line, the data voltage is transferred to the second node,
wherein in response a pulse of the data voltage corresponding to a low gradation being supplied to the first electrode of the capacitor during the second time period, the compensation voltage supplied to the capacitor linearly increases during the second time period,
wherein in response a pulse of the data voltage corresponding to a high gradation being supplied to the first electrode of the capacitor during the second time period, the compensation voltage supplied to the capacitor linearly decreases during the second time period, and wherein the high gradation corresponds to a bright luminance and the low gradation corresponds to a low luminance lower than the bright luminance.

2. The organic light emitting display device of claim 1, wherein the organic light emitting diode receives power from the first voltage line connected to the driving transistor, and wherein the second voltage line supplies the compensation voltage and the compensation voltage changes during the second time period.

3. The organic light emitting display device of claim 1, wherein the organic light emitting diode receives power from the first voltage line connected to the driving transistor.

4. The organic light emitting display device of claim 1, wherein the compensation voltage supplied to the at least one pixel instantly decreases in response to the data voltage corresponding to the high gradation.

5. The organic light emitting display device of claim 1, wherein the compensation voltage supplied to the at least one pixel instantly increases in response to the data voltage corresponding to the low gradation.

6. The organic light emitting display device of claim 1, wherein the compensation voltage reduces a flicker in the display panel during the standby mode.

7. The organic light emitting display device of claim 1, wherein the compensation voltage maintains a luminance of the at least one pixel at a constant level during the second time period.

8. The organic light emitting display device of claim 1, wherein when the initialization voltage transfer transistor is turned on, a threshold voltage of the organic light emitting diode is higher than the initialization voltage and a current is prevented from flowing through the organic light emitting diode.

9. An organic light emitting display device, comprising:
a display panel including a plurality of pixels and configured to express brightness based on a driving current corresponding to a data voltage;
a controller configured to:
drive the display panel with high frequency driving based on a mode control signal, and
drive the display panel with low frequency driving that updates the data voltage less frequently than the high frequency driving based on the mode control signal; and
a power source unit configured to:
receive the mode control signal from the controller,
supply a first power source and a second power source to the display panel, and
supply a compensation voltage to at least one pixel among the plurality of pixels during the low frequency driving to maintain the magnitude of the driving current,
wherein the at least one pixel comprises:
an organic light emitting diode;
a driving transistor for supplying the driving current to the organic light emitting diode;
a second transistor including a first electrode connected to a data line, a gate electrode connected to a gate line, and a second electrode connected to a first electrode of a capacitor, the capacitor configured to store a voltage corresponding to the data voltage and including a second electrode connected to a first node;

a third transistor connected between the first node and a second node between the driving transistor and the organic light emitting diode, the third transistor including a gate electrode connected to the gate line;
a fourth transistor including a first electrode connected to a second voltage line, a second electrode connected between the second electrode of the second transistor and the first electrode of the capacitor, and a gate electrode connected to a light emission control line;
a fifth transistor including a first electrode connected to the second node, a second electrode connected to an electrode of the organic light emitting diode, and a gate electrode connected to the light emission control line; and
an initialization voltage transfer transistor including a first electrode directly connected to the second voltage line and directly connected to the first electrode of the fourth transistor, a second electrode directly connected to the electrode of the organic light emitting diode, and a gate electrode directly connected to an initialization control line providing an initialization control signal for initializing the organic light emitting diode, the initialization voltage transfer transistor configured to supply an initialization voltage from the second voltage line to the electrode of the organic light emitting diode based on the initialization control signal from the initialization control line, wherein the initialization control line is not connected to the gate electrode of second transistor, wherein the compensation voltage is supplied to the capacitor during the low frequency driving via the fourth transistor, wherein when the second transistor and the third transistor are turned on based a gate signal from the gate line, the data voltage is transferred to the second node, wherein in response a pulse of the data voltage corresponding to a low gradation being supplied to the first electrode of the capacitor during the low frequency driving, the compensation voltage supplied to the capacitor linearly increases during the low frequency driving, wherein in response a pulse of the data voltage corresponding to a high gradation being supplied to the first electrode of the capacitor during the low frequency driving, the compensation voltage supplied to the capacitor linearly decreases during the low frequency driving, and wherein the high gradation corresponds to a bright luminance and the low gradation corresponds to a low luminance lower than the bright luminance.

10. The organic light emitting display device of claim 9, wherein the at least one pixel receives power from the first voltage line connected to the driving transistor, and wherein the second voltage line supplies the compensation voltage to the at least one pixel and the compensation voltage changes during the low frequency driving.

11. The organic light emitting display device of claim 9, wherein the at least one pixel receives power from the first voltage line connected to the driving transistor.

12. The organic light emitting display device of claim 9, wherein the compensation voltage supplied to the at least one pixel instantly decreases in response to the data voltage corresponding to the high gradation, and wherein the compensation voltage supplied to the at least one pixel instantly increases in response to the data voltage corresponding to the low gradation.

13. The organic light emitting display device of claim 9, wherein when the initialization voltage transfer transistor is turned on, a threshold voltage of the organic light emitting diode is higher than the initialization voltage and a current is prevented from flowing through the organic light emitting diode.

14. A driving method of controlling an organic light emitting display device including a plurality of pixels, which express brightness based on a magnitude of a driving current corresponding to an applied data voltage, the method comprising:
  outputting a mode control signal enabling at least one pixel among the plurality of pixels to operate in a normal driving mode or a standby driving mode;
  applying a data voltage from a second transistor, via a capacitor, to a gate electrode of a driving transistor connected to an organic light emitting diode in the at least one pixel during the normal driving mode or the standby driving mode; and
  maintaining an amount of the driving current that flows through the at least one pixel at a level corresponding to the data voltage and supplying a compensation voltage to the capacitor, via a fourth transistor, during the standby driving mode when the pixel is operated in the standby driving mode,
  wherein the second transistor includes a first electrode connected to a data line, a gate electrode connected to a gate line, and a second electrode connected to a first electrode of the capacitor, the capacitor configured to store a voltage corresponding to the data voltage and including a second electrode connected to a first node;
  wherein a third transistor is connected between the first node and a second node between the driving transistor and the organic light emitting diode, the third transistor including a gate electrode connected to the gate line,
  wherein the fourth transistor includes a first electrode connected to a second voltage line configured to supply the compensation voltage, a second electrode connected between the second electrode of the second transistor and the first electrode of the capacitor, and a gate electrode connected to a light emission control line,
  wherein a fifth transistor includes a first electrode connected to the second node, a second electrode connected to an electrode of the organic light emitting diode, and a gate electrode connected to the light emission control line,
  wherein an initialization voltage transfer transistor includes a first electrode directly connected to the second voltage line and directly connected to the first electrode of the fourth transistor, a second electrode directly connected to the electrode of the organic light emitting diode, and a gate electrode directly connected to an initialization control line providing an initialization control signal for initializing the organic light emitting diode, and the initialization voltage transfer transistor supplies an initialization voltage from the second voltage line to the electrode of the organic light emitting diode based on the initialization control signal from the initialization control line,
  wherein the initialization control line is not connected to the gate electrode of second transistor,
  wherein when the second transistor and the third transistor are turned on based a gate signal from the gate line, the data voltage is transferred to the second node,
  wherein in response a pulse of the data voltage corresponding to a low gradation being supplied to the first electrode of the capacitor during the standby driving mode, the compensation voltage supplied to the capacitor linearly increases during the standby driving mode,
  wherein in response a pulse of the data voltage corresponding to a high gradation being supplied to the first electrode of the capacitor during the standby driving mode, the compensation voltage supplied to the capacitor linearly decreases during the standby driving mode, and
  wherein the high gradation corresponds to a bright luminance and the low gradation corresponds to a low luminance lower than the bright luminance.

15. The method of claim 14, wherein the data voltage applied to the at least one pixel is updated after a first time period during the normal driving mode, and
  wherein the data voltage applied to the at least one pixel is updated after a second time period that is longer than the first time period during the standby driving mode.

16. The method of claim 14, wherein the compensation voltage supplied to the at least one pixel instantly decreases in response to the data voltage corresponding to the high gradation, and
  wherein the compensation voltage supplied to the at least one pixel instantly increases in response to the data voltage corresponding to the low gradation.

17. The method of claim 14, wherein when the initialization voltage transfer transistor is turned on, a threshold voltage of the organic light emitting diode is higher than the initialization voltage and a current is prevented from flowing through the organic light emitting diode.

18. An organic light emitting display device, comprising:
  a display panel including at least one pixel and configured to express brightness based on a driving current corresponding to a data voltage,
  wherein the at least one pixel comprises:
    an organic light emitting diode;
    a driving transistor for supplying the driving current to the organic light emitting diode;
    a second transistor including a first electrode connected to a data line, a gate electrode connected to a gate line, and a second electrode connected to a first electrode of a capacitor, the capacitor configured to store a voltage corresponding to the data voltage and including a second electrode connected to a first node;
    a third transistor connected between the first node and a second node between the driving transistor and the organic light emitting diode, the third transistor including a gate electrode connected to the gate line;
    a fourth transistor including a first electrode connected to a second voltage line, a second electrode connected between the second electrode of the second transistor and the first electrode of the capacitor, and a gate electrode connected to a light emission control line;
    a fifth transistor including a first electrode connected to the second node, a second electrode connected to an electrode of the organic light emitting diode, and a gate electrode connected to the light emission control line; and
    an initialization voltage transfer transistor including a first electrode directly connected to the second voltage line and directly connected to the first electrode of the fourth transistor, a second electrode directly connected to the electrode of the organic light emitting diode, and a gate electrode directly connected to an initialization control line providing an initialization control signal for initializing the organic light emitting diode, the initialization voltage transfer transistor configured to supply an initialization voltage from the second voltage line to the electrode of the organic light emitting diode based on the initialization control signal from the initialization control line, wherein the initialization control line is not connected to the gate electrode of second transistor, wherein a compensation voltage is supplied to the capacitor via the fourth transistor during a standby mode for compensating a change in the data voltage in the at least one pixel, wherein when the second transistor and the third transistor are turned on based a gate signal from the gate line, the data voltage is transferred to the second node, wherein in response a pulse of the data voltage corresponding to a low gradation being supplied to the first electrode of the capacitor during the standby mode, the compensation voltage supplied to the capacitor linearly increases during the standby mode, wherein in response a pulse of the data voltage corresponding to a high gradation being supplied to the first electrode of the capacitor during the standby mode, the compensation voltage supplied to the capacitor linearly decreases during the standby mode, and wherein the high gradation corresponds to a bright luminance and the low gradation corresponds to a low luminance lower than the bright luminance.

* * * * *